United States Patent [19]

Carroll et al.

[11] Patent Number: 5,070,936
[45] Date of Patent: Dec. 10, 1991

[54] HIGH INTENSITY HEAT EXCHANGER SYSTEM

[75] Inventors: Charles B. Carroll, Trenton; Ching-Yue Lai, Lawrenceville, both of N.J.

[73] Assignee: United States of America as represented by the Secretary of the Air Force, Washington, D.C.

[21] Appl. No.: 656,885

[22] Filed: Feb. 15, 1991

[51] Int. Cl.[5] .............................................. F28F 7/00
[52] U.S. Cl. .................................. 165/80.4; 361/385; 361/387; 165/185
[58] Field of Search ............... 361/385, 387; 165/80.3, 165/80.4, 185

[56] References Cited

U.S. PATENT DOCUMENTS

| | | | |
|---|---|---|---|
| 4,561,040 | 12/1985 | Eastman et al. | 361/385 |
| 4,574,879 | 3/1986 | DeGree et al. | 165/185 |
| 4,729,060 | 3/1988 | Yamamoto et al. | 361/385 |
| 4,740,866 | 4/1988 | Kajiwara et al. | 361/382 |
| 4,782,893 | 11/1988 | Thomas | 155/185 |
| 4,783,721 | 11/1988 | Yamamoto et aL. | 361/382 |
| 4,823,869 | 4/1989 | Arnold et al. | 165/185 |
| 4,909,315 | 3/1980 | Nelson et al. | 165/80.3 |

*Primary Examiner*—Allen J. Flanigan
*Attorney, Agent, or Firm*—Irwin P. Garfinkle; Donald J. Singer

[57] ABSTRACT

A high intensity heat exchanger that uses a solid copper heat sink having a plurality of integral pins formed on one side thereof, and an electrical insulator comprised of thin film of aluminum nitride (AlN) or diamond-like carbon (C) deposited on the other side. A device to be cooled, such as a computer chip, or an infrared detector cell is secured to the insulating layer by means of a very thin film of solder. A cooling liquid is circulated to the pins through conduits which also support the heat sink. The pins have a rectangular cross section and the spacing of the pins, and the fluid velocity are optimized to provide turbulent flow around the pins. The apparatus is provided with a space under the pins for a removable orifice plate, thereby enabling the optimization of the size, shape and number of orifices for a particular application.

9 Claims, 1 Drawing Sheet

HIGH INTENSITY HEAT EXCHANGER SYSTEM

STATEMENT OF GOVERNMENT INTEREST

The invention described herein may be manufactured and used by or for the Government for governmental purposes without the payment of any royalty thereon.

This invention relates to a high intensity heat exchanger that used a solid copper heat sink having a plurality of integral pins formed on one side thereof, and an electrical insulator comprised of thin film of aluminum nitride (AlN) or diamond like carbon (C) deposited on the other side. Alternatively, a thin (0.003") layer of BeO can act as the insulating surface. Plating techniques allow thin solder (5 microns) to bond the BeO to the copper plate. A device to be cooled, such as a computer chip, an infrared detector cell, or a solid state laser is secured to the insulating layer by means of a very thin film of solder. A cooling liquid is circulated to the pins through conduits which also support the heat sink. The pins have a rectangular cross section and the spacing of the pins, and the fluid velocity are optimized to provide turbulent and impinging flow around the pins. The apparatus is provided with a space under the pins for a removable orifice plate, thereby enabling the optimization of the size, shape and number of orifices for a particular application.

OBJECTS OF THE INVENTION

It is an object of this invention to provide a high intensity heat exchange system for a semiconductor chip or similar printed circuit in which there are both isolated electrical contacts and a very low thermal resistance path.

Another object of this invention to provide a high intensity heat exchange system for semiconductor chip or similar printed circuit in which there are both isolated electrical contacts and a very low thermal resistance path, and which is sealed, compact, low cost and readily manufacturable.

THE PRIOR ART

A search of the prior art revealed a number of prior patents: (1) U.S. Pat. No. 4,748,866, (2) U.S. Pat. No. 4,561,040, (3) U.S. Pat. No. 4,729,060 and (4) U.S. Pat. No. 4,783,721.

U.S. Pat. No. 4,748,866, issued June 7, 1988 discloses a semiconductor module cooling structure comprising a housing having a passage through which a cooling fluid flows; a cooling block to which the cooling fluid is supplied from the housing and which has an electrical insulating layer at the bottom portion and is combined with a semiconductor chip through the electrical insulating layer; and a bellows which is connected between the housing and the cooling block. The cooling fluid is supplied to the cooling block through the bellows. The bellows is formed in a manner such that a plurality of substantially plane ring-like metal plates are laminated, pressed, diffused, joined, and thereafter stretched and molded.

U.S. Pat. No. 4,561,040, issued Dec. 24, 1985 disclosed a system for cooling integrated circuit chips and particularly those involving very large scale integrated circuits; the system provides for closely associating the heat-sink or heat exchange element with the integrated circuit chip by having the heat-sink, in the form of a "cooling chip", in intimate contact with the back surface, (in a "flip chip" configuration, the front, or circuit-implemented, surface, makes contact with a ceramic carrier or module): the cooling chip is provided with a plurality of spaced parallel groves which extend along the one side or surface opposite the surface that is in bearing contact with the integrated circuit chip, whereby liquid coolant flows through the grooves so as to remove heat from the integrated circuit chip; further included in the system is a specially configured bellows for conducting the liquid coolant from a source to the heat-sink, and for removing the liquid coolant; a coolant distribution means, in the form of at least one glass plate manifold, is provided with spaced passageways interconnecting the respective incoming and outgoing coolant flow paths of the bellows with the heat-sink.

U.S. Pat. No. 4,729,060 issued Dec. 24, 1985, discloses a cooling module for an electronic circuit component on a printed circuit board includes a passage in which a coolant flows, a first heat transfer plate exposed to the flow of the coolant, a second heat transfer plate secured to the circuit component, a compliant member between the first and second heat transfer plates for establishing a compliant contact therebetween, and a bellows connected to the first heat transfer plate to elastically press the first heat transfer plate against the circuit component through the compliant member and the second heat transfer plate.

U.S. Pat. No. 4,783,721 issued Nov. 8, 1988 discloses a cooling system including a cooling module which has a heat transfer plate that is exposed to a flow of coolant and is elastically biased toward a circuit component on a printed circuit board for transferring heat dissipated by the component to the coolant, and means for guiding and preventing improper alignment of the transfer plate as the same as resiliently biased toward the circuit component. The coolant module may include a solder or low-melting-point metal for establishing thermal contact between the transfer plate and the circuit component.

None of the foregoing patent disclose the unique cooling arrangement of the present invention.

DESCRIPTION OF THE DRAWING

For a better understanding of the nature and scope of this invention reference should now be made to the following detailed specification and the accompanying drawing in which.

DESCRIPTION OF THE PREFERRED EMBODIMENT

Figure 1:
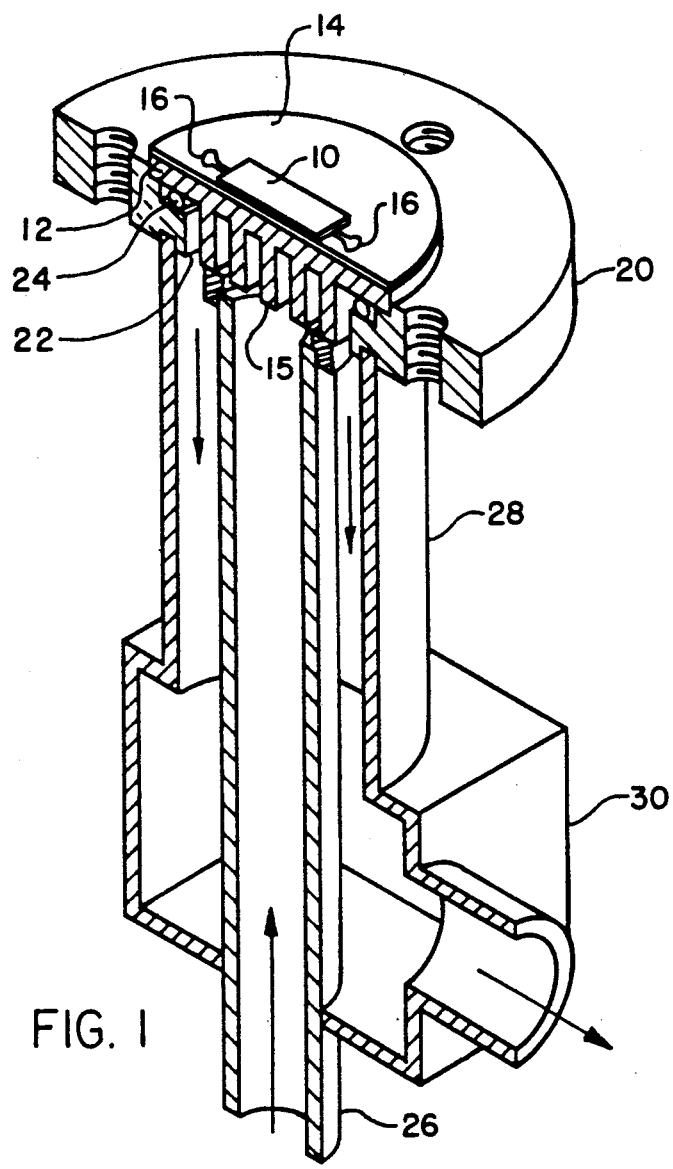
FIG. 1 is a cutaway cross section of a preferred embodiment of this invention.

Referring to the drawings, there is shown an electro-optic or electronic device 10 to be cooled by the apparatus disclosed herein. The device 10 is supported on a heat sink which comprises a solid copper disc 12. The top surface of the disc 12 is electrically insulated by a deposited thin film of insulating material 14. Extending axially from the other side of the disc 12, and integral therewith, are a plurality of pins 15. The pins 15 have a rectangular cross section formed by cutting a first series of spaced parallel slots 17 in the bottom surface of the disc 12, and then cutting a second series of such slots perpendicular to the first.

In a preferred system, the insulation materials is aluminum nitride (AlN) or diamond-like carbon (C) deposited on the surface by known conventional techniques. These materials are particularly useful since they bond to the copper without adding additional bonding materials, and thus they provide very good electrical insulating qualities without substantially affecting heat conductivity.

Prior to the deposition of the insulating material on the top surface of the copper disc 12, the top surface may be ground and lapped very flat. After deposition, the thin film of insulating material 14 may be lightly lapped to provide a good mounting surface of the quality required for an optical device.

The insulating material 12 is deposited to a thickness of about 3 microns, and while providing good electrical insulation of the device 10 from the copper disc 12, materials such as AlN and diamond-like carbon also provide a very short thermal path and good material thermal conductivities. This very short thermal path, good material thermal conductivities and no bonding agent between the copper surface and the insulator provide an advantageous design.

A pattern of metallic circuit traces 16 of copper, or other conductive metal, is applied to the insulator 14. These traces are patterned to match the particular application, and will provide the electrical connection points for the electronic or electro-optic device 10. The attachment of the device 10 to the insulating material 14 is made with a thin layer of solder 18.

The copper disc 12, and the components associated with it are supported by the structure which supplies coolant to the pins 15. The supporting structure includes a metal support plate or disc 20 having a central aperture 22 in which the copper disc 12 is seated on an inner flange 23. An O-ring 24 provides a seal between the two discs. A clamp ring 25 clamps the disc 12 to the disc 20 by means of screws 27, and compresses the O-ring 24 to provide a water tight seal.

Cooling fluid is pumped to the pins 15 through an inlet pipe 26 from a reservoir (not shown). The cooling fluid passes through and around the pins 15 and returns to the reservoir (not shown) through a concentric outlet pipe 28 and expansion chamber 30.

Figure 2:
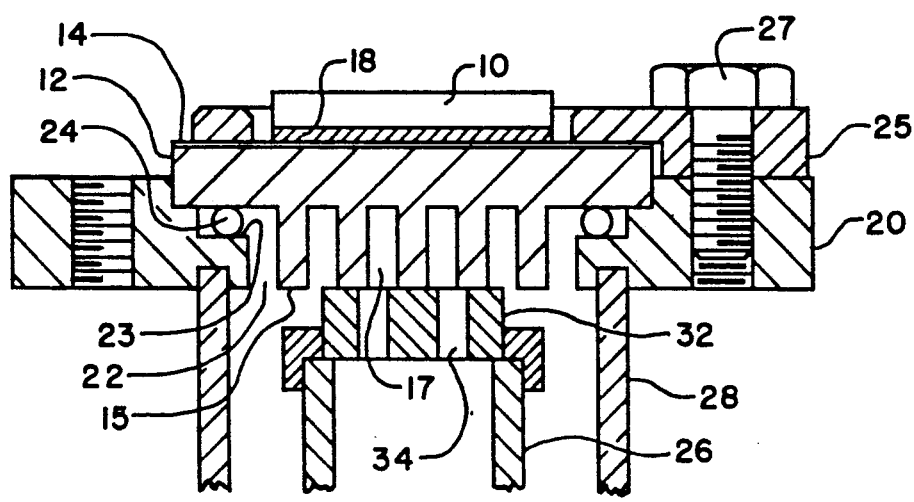
FIG. 2 is a sectional view showing the various very thin layers enlarged.

As seen only in FIG. 2, a removable disc 32 having orifices 34 is removably seated between the end of pipe 26 and the ends of the pins 15.

The cooling fluid is fed to the pins 15 from the center pipe 26 and the fluid will impinge on the pins 15. The flow rates, and the spacing of the pins are selected so that there is turbulent and impinging flow around the pins. Turbulence is enhanced because of the rectillinear cross section of the pins.

The removable disc 32 for which a space is provided between the pins 15 and the inlet pipe 26 must be optimized for the particular application, and therefore the number, size and location of the orifices are determined on the basis of the required performance. The disc 32 could allow multiple devices 12 to be cooled by providing separate cooling flows for each device.

Since the inlet pipe 26 is concentric within the outlet pipe 24 the system is very compact. In addition, there is a layer (not shown) of insulation 36 surrounding the outlet pipe, so that the system is very energy efficient.

The disclosed system has many advantages. The entire copper disc and its associated elements can be removed simply by unscrewing the clamp ring 25. This provides great flexibility for the user since different devices 10 can use the same heat exchanger, or poorly performing devices can be replaced. Moreover, the copper disc 12, with the insulation material applied to it can be re-used after removing the solder. If required, an optically flat surface can be regained by grinding or lapping the mounting surface.

The interface between the heat sink and the coolant supply performs multiple functions. It is easily produced and can be readily customized for different applications. It provides for the mounting and sealing of the heat sink and it provides for a replaceable inlet orifice plate 34. It also provides the outlet orifices for the cooling fluid after the heat has been exchanged. Because the inlet pipe is inside and concentric with the outlet pipe, a very compact packaging results and is energy efficient since the newly chilled fluid is exposed to an ambient only a few degrees warmer than itself, rather than the system ambient. The fluid outlet pipe, which is welded to the disc 20, provides a low pressure return path for the coolant.

In summary, the disclosed heat exchanger system has the following advantages:

1. The system provides high heat removal. For example, it provides more than 200 W/square centimeter (30 degrees C. surface) using water as a coolant.

2. It provides a small footprint in operating area, approximately 1.5" diameter for a 1 square centimeter heat exchanger area. The total footprint can be reduced to the 1 cm$^2$ cooled surface.

3. It uses a thin thermally efficient insulating surface of 3-5 micron AlN or diamond-like carbon.

4. The mounting surface for the device to be cooled is capable of being lapped or ground to provide a very flat.

5. The system can be operated in any orientation since it is not gravity sensitive.

6. The system is rugged in construction.

7. It is readily customized to fit various applications.

8. The system is energy efficient.

9. The system is scalable and reuseable.

10. The 200 w/cm$^2$ cooling power can be achieved with a very low system pressure of less than 20 psia.

It will be apparent to persons skilled in the art that this invention is subject to various modifications and adaptations. It is intended, therefore, that the scope of the invention be limited only by the appended claims as interpreted in the light of the prior art.

What is claimed is:

1. A high intensity heat exchanger for cooling a heat sensitive electronic device comprising:
    a heat sink comprising a thick conducting metal slab having a flat upper surface for mounting said device;
    a plurality of pins integral with and extending from the lower surface of said metal slab;
    a thin layer of electrical insulation material adhered to said upper surface, said material having a short thermal path; and
    a source of cooling fluid;
    means for circulating said cooling fluid around said pins, said means comprising: a support disc having a central opening, said slab being clamped on said disc with said pins extending through said opening, and first and second co-axial conduits supported from said support disc, said cooling fluid being supplied to said pins through said first conduit, and returned to said source through said second conduit; and
    a disc interposed between said first conduit and said pins, said disc having openings, the size and location of said openings regulating and directing the flow of cooling fluid to said pins.

2. The heat exchanger as defined in claim 1 wherein said slab is a copper disc.

3. The heat exchanger as defined in claim 1 wherein said pins are rectangular in cross section.

4. The heat exchanger as defined in claim 1 wherein said layer is aluminum nitride or diamond-like carbon.

5. A high intensity heat exchanger for cooling a heat sensitive electronic device comprising:

a heat sink comprising a thick conducting metal slab having a flat upper surface for mounting said device;

a plurality of pins integral with and extending from the lower surface of said metal slab;

a thin layer of electrical insulation material adhered to said upper surface, said material having a short thermal path;

a source of cooling fluid, said cooling fluid being supplied to said pins through a conduit; and a disc interposed between said conduit and said pins, said disc having openings, the size and location of said openings regulating and directing the flow of cooling fluid to said pins.

6. The heat exchanger as defined in claim 5 wherein said slab is a copper disc.

7. The heat exchanger as defined in claim 5 wherein said pins are rectangular in cross section.

8. The heat exchanger as defined in claim 5 wherein said layer is aluminum nitride or diamond-like carbon.

9. The heat exchanger as defined in claim 8 wherein said slab is a copper disc.

* * * * *